(12) United States Patent  (10) Patent No.: US 8,120,917 B2
Tan  (45) Date of Patent: Feb. 21, 2012

(54) HEAT DISSIPATION DEVICE

(75) Inventor: Zeu-Chia Tan, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 76 days.

(21) Appl. No.: 12/824,511

(22) Filed: Jun. 28, 2010

(65) Prior Publication Data

US 2011/0292608 A1 Dec. 1, 2011

(30) Foreign Application Priority Data

May 31, 2010 (TW) ................................ 99117369 A

(51) Int. Cl.
H05K 7/20 (2006.01)
F28D 15/00 (2006.01)

(52) U.S. Cl. ..................... 361/700; 165/104.33; 361/719
(58) Field of Classification Search ................... 361/700
See application file for complete search history.

(56) References Cited

U.S. PATENT DOCUMENTS

| 6,585,039 | B2 * | 7/2003 | Sagal et al. | 165/185 |
| 7,697,293 | B1 * | 4/2010 | Peng et al. | 361/700 |
| 7,800,905 | B1 * | 9/2010 | Yu | 361/700 |
| 2004/0255768 | A1 * | 12/2004 | Rettenbacher et al. | 89/36.02 |
| 2006/0238982 | A1 * | 10/2006 | Lee et al. | 361/700 |
| 2008/0198550 | A1 * | 8/2008 | Wang et al. | 361/700 |

* cited by examiner

Primary Examiner — Gregory Thompson
(74) Attorney, Agent, or Firm — Altis Law Group, Inc.

(57) ABSTRACT

An exemplary heat dissipation device includes first and second heat sinks adapted for being thermally attached to first and second electronic components, respectively; and a heat pipe thermally interconnecting the first heat sink with the second heat sink.

14 Claims, 3 Drawing Sheets

HEAT DISSIPATION DEVICE

BACKGROUND

1. Technical Field

The disclosure relates to heat dissipation devices, and particularly to a heat dissipation device for simultaneously cooling two electronic components.

2. Description of Related Art

A printed circuit board in an electronic apparatus such as a computer or a server is generally provided with many electronic components. The electronic components are mounted on the printed circuit board at intervals, and generate a large amount of heat during operation. Each major electronic component is provided with a heat sink for dissipating heat generated therefrom. Since the interior space of the electronic apparatus is very limited, all the heat sinks cooperatively use only one fan for providing airflow to take the heat of the heat sinks away. However, during operation of the electronic components, airflow from the fan is partially blocked by a nearby heat sink, and cannot properly reach a faraway heat sink. This is liable to result in undesirable differences in operating temperatures between the electronic components located at different positions relative to the fan.

What is needed, therefore, is a heat dissipation device for cooling electronic components which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Figure 1:
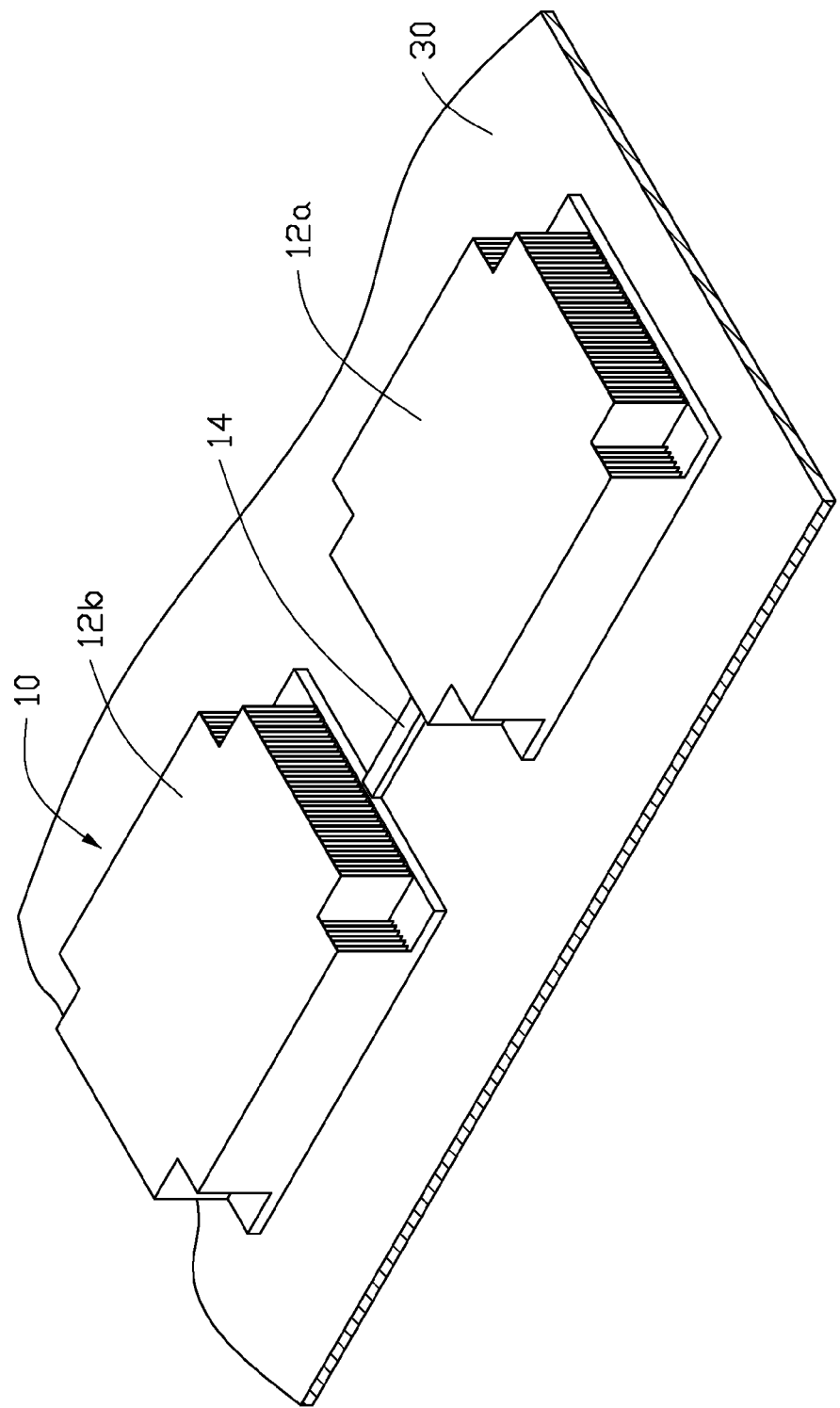
FIG. 1 is an isometric, assembled view of a heat dissipation device in accordance with one embodiment of the disclosure, showing the heat dissipation device mounted on electronic components (not visible) on a printed circuit board.
Figure 3:
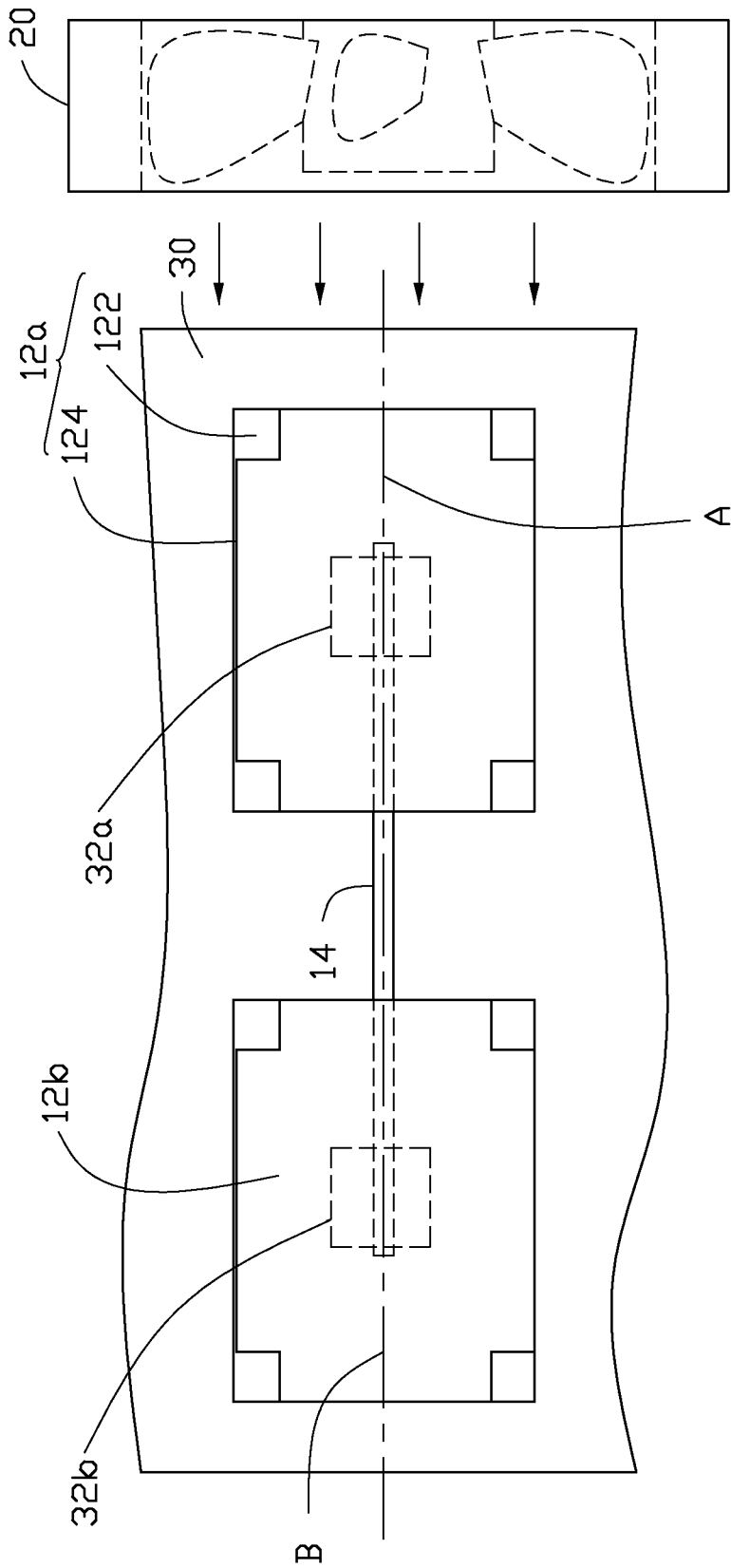
FIG. 3 is a top plan view of the heat dissipation device and the other components of FIG. 1, together with a fan.

Referring to FIGS. 1 and 3, a heat dissipation device 10 in accordance with an embodiment of the disclosure is used for simultaneously dissipating heat from two spaced electronic components 32a, 32b disposed on a printed circuit board 30. The heat dissipation device 10 includes two separate heat sinks 12a, 12b mounted on the printed circuit board 30 and thus positioned in thermal contact with the electronic components 32a, 32b, and a heat pipe 14 thermally interconnecting the two heat sinks 12a, 12b. In a typical application, a fan 20 is arranged near the heat sink 12a and far away from the heat sink 12b. In the illustrated embodiment, the heat sinks 12a, 12b and the fan 20 are arranged in a line. The heat sink 12a is located between the heat sink 12b and the fan 20. The fan 20 is located at one side of heat sink 12a which is farthest away from the heat sink 12b.

Figure 2:
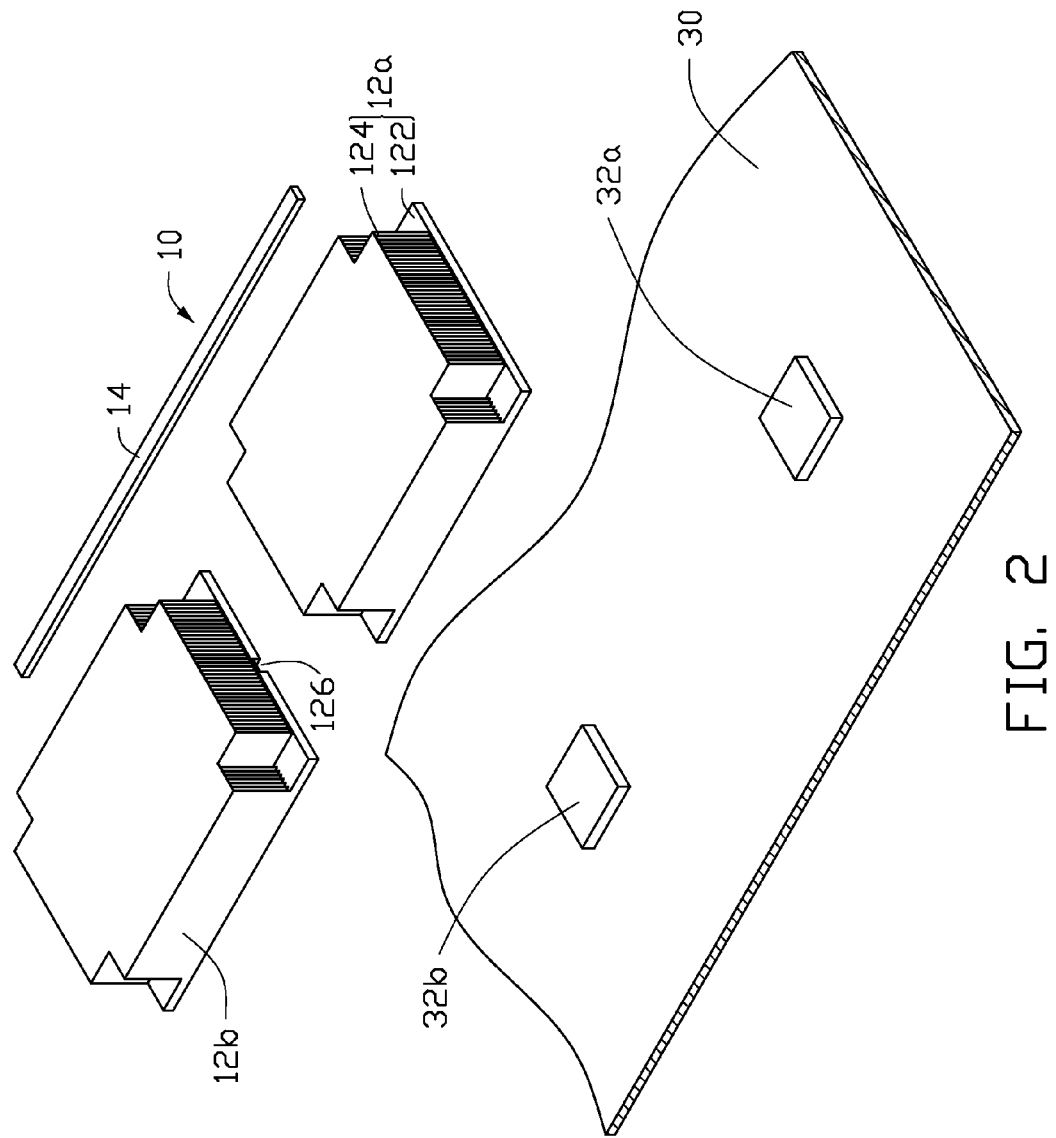
FIG. 2 is an exploded view of the heat dissipation device and the other components of FIG. 1.

Also referring to FIG. 2, each of the heat sinks 12a, 12b is integrally made of metal such as aluminum, copper or an alloy thereof, and includes a rectangular heat conducting plate 122 and a plurality of fins 124 upwardly and vertically extending from a top face of the heat conducting plate 122. A bottom face of the heat conducting plate 122 thermally contacts a corresponding one of the electronic components 32a, 32b. An elongated groove 126 is defined in a bottom of the heat conducting plate 122. The fins 124 at four corners of the heat conducting plate 122 are truncated in order to provide for means for fastening the heat sinks 12a, 12b on the printed circuit board 30. A plurality of airflow channels (not labeled) are defined between adjacent fins 124. The fins 124 of the heat sink 12a are parallel to each other and parallel to a first axis A (see FIG. 3), and the fins 124 of the heat sink 12b are parallel to each other and parallel to a second axis B (see FIG. 3). The fins 124 of the heat sink 12a are substantially aligned with the fins 124 of the heat sink 12b. The first axis A is collinear with the second axis B. The heat pipe 14 is substantially parallel to the first and second axes A, B. In the illustrated embodiment, the heat pipe 14 is aligned on the first and second axes A, B.

The heat pipe 14 is flat, and two ends of the heat pipe 14 are respectively received in the grooves 126 of the heat sinks 12a, 12b. A bottom face of each of the two ends of the heat pipe 14 thermally contacts the corresponding electronic component 32a, 32b. In this embodiment, the heat pipe 14 has a heat transfer coefficient larger than that of the heat conducting plates 122 of the heat sinks 12a, 12b. It is understandable that the heat pipe 14 and the heat sinks 12a, 12b can be made of the same material in other embodiments.

During operation of the electronic components 32a, 32b, heat from the electronic components 32a, 32b is absorbed by the heat pipe 14 and by the heat conducting plates 122 of the heat sinks 12a, 12b firstly, and then transmitted to the fins 124 of the heat sinks 12a, 12b. Airflow generated from the fan 20 flows through the airflow channels between the fins 124 of the heat sinks 12a, 12b to remove the heat of the fins 124. Since the fan 20 is located near the heat sink 12a yet far away from the heat sink 12b, the airflow firstly reaches the heat sink 12a and thereafter reaches the heat sink 12b. A portion of the airflow is inevitably blocked by the nearby heat sink 12a and cannot reach the faraway heat sink 12b. Thus, the faraway heat sink 12b receives a smaller amount of airflow from the fan 20 than the nearby heat sink 12a.

However, since the faraway heat sink 12b is thermally connected with the nearby heat sink 12a by the heat pipe 14, the heat pipe 14 can efficiently and timely transmit the heat from the faraway heat sink 12b to the nearby heat sink 12a when the faraway heat sink 12b has a higher temperature than the nearby heat sink 12a. Thus, even though the airflow from the fan 20 is blocked by the nearby heat sink 12a and cannot optimally ventilate the faraway heat sink 12b, a great difference in temperature between the heat sinks 12a, 12b is avoided. Accordingly, a great difference in temperature between the electronic components 32a, 32b can also be avoided.

It is believed that the embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A heat dissipation device comprising:
   first and second heat sinks adapted for being thermally attached to first and second electronic components, respectively, wherein each of the first and second heat sinks comprises a heat conducting plate defining an elongated groove in a bottom thereof, and a plurality of fins upwardly extending from the heat conducting plate, a plurality of airflow channels being defined between adjacent fins;

a fan arranged adjacent to the first heat sink yet away from the second heat sink for generating airflow through the airflow channels of the first and second heat sinks; and a heat pipe thermally interconnecting the first heat sink with the second heat sink, two ends of the heat pipe being respectively received in the grooves of the first and second heat sinks.

2. The heat dissipation device of claim 1, wherein the heat pipe is flat.

3. The heat dissipation device of claim 2, wherein the two ends of the heat pipe are adapted for thermally contacting the first and second electronic components, respectively.

4. The heat dissipation device of claim 3, wherein the heat pipe has a heat transfer coefficient larger than that of each of the heat conducting plates of the first and second heat sinks.

5. The heat dissipation device of claim 1, wherein the first and second heat sinks and the fan are arranged in a line, and the first heat sink is located between the second heat sink and the fan.

6. The heat dissipation device of claim 5, wherein the fan is located at one side of the first heat sink which is farthest away from the second heat sink.

7. An electronic assembly comprising:

a circuit board;

first and second electronic components mounted on the circuit board;

first and second heat sinks thermally attached to the first and second electronic components, respectively, wherein each of the first and second heat sinks comprises a heat conducting plate defining an elongated groove in a bottom thereof, and a plurality of fins upwardly extending from the heat conducting plate, a plurality of airflow channels being defined between adjacent fins;

a fan arranged near the first heat sink yet away from the second heat sink for generating airflow through the airflow channels of the first and second heat sinks; and a heat pipe thermally interconnecting the first heat sink and the second heat sink, two ends of the heat pipe being respectively received in the grooves of the first and second heat sinks.

8. The electronic assembly of claim 7, wherein the heat pipe is flat, and the two ends of the heat pipe are adapted for thermally contacting the first and second electronic components, respectively.

9. The electronic assembly of claim 7, wherein the first and second heat sinks and the fan are arranged in a line, and the first heat sink is located between the second heat sink and the fan.

10. The electronic assembly of claim 9, wherein the fan is located at one side of the first heat sink which is farthest away from the second heat sink.

11. A heat dissipation device comprising:

first and second heat sinks adapted for being thermally attached to first and second electronic components, respectively; and a heat pipe thermally interconnecting the first heat sink with the second heat sink, wherein each of the first and second heat sinks comprises a heat conducting plate and a plurality of fins upwardly extending from the heat conducting plate, the fins of the first heat sink are parallel to each other and parallel to a first axis, the fins of the second heat sink are parallel to each other and parallel to a second axis, and the first axis is parallel to the second axis;

wherein the heat conducting plates of the first and second heat sinks each define an elongated groove in a bottom thereof, and two ends of the heat pipe are respectively received in the grooves of the first and second heat sinks.

12. The heat dissipation device of claim 11, wherein the fins of the first heat sink are substantially aligned with the fins of the second heat sink.

13. The heat dissipation device of claim 12, wherein the first axis is collinear with the second axis.

14. The heat dissipation device of claim 13, wherein the heat pipe is substantially parallel to the first and second axes.

\* \* \* \* \*